United States Patent [19]
Kawase et al.

[11] Patent Number: 5,734,143
[45] Date of Patent: Mar. 31, 1998

[54] MICROWAVE PLASMA TORCH HAVING DISCRETELY POSITIONED GAS INJECTION HOLES AND METHOD FOR GENERATING PLASMA

[75] Inventors: Toru Kawase, Katano; Yoshinobu Nagano, Kyoto; Tadashi Kimura, Kyoto; Yoshikazu Yoshida, Kofu; Shinichi Mizuguchi, Katano, all of Japan

[73] Assignee: Matsushita Electric Industrial Co., Ltd., Kadoma, Japan

[21] Appl. No.: 546,834

[22] Filed: Oct. 23, 1995

[30] Foreign Application Priority Data

Oct. 26, 1994 [JP] Japan ................................. 6-262332
Oct. 28, 1994 [JP] Japan ................................. 6-265321

[51] Int. Cl.$^6$ .................................................. B23K 10/00
[52] U.S. Cl. ........................... 219/121.43; 219/121.41; 219/121.47; 204/298.38
[58] Field of Search ........................ 219/121.4, 121.43, 219/121.52, 121.59, 121.41, 121.47; 315/111.21, 111.41, 111.81; 204/298.37, 298.38; 156/345, 646, 643

[56] References Cited

U.S. PATENT DOCUMENTS

| | | | |
|---|---|---|---|
| 4,473,736 | 9/1984 | Bloyet et al. | 219/121 PM |
| 4,609,808 | 9/1986 | Bloyet et al. | 219/121 PR |
| 4,894,510 | 1/1990 | Nakanishi et al. | 219/121.43 |
| 5,032,202 | 7/1991 | Tsai et al. | 156/345 |
| 5,053,678 | 10/1991 | Koike et al. | 315/111.81 |
| 5,081,398 | 1/1992 | Asmussen et al. | 365/111.51 |
| 5,389,154 | 2/1995 | Hiroshi et al. | 118/723 MR |
| 5,432,315 | 7/1995 | Kaji et al. | 219/121.43 |

FOREIGN PATENT DOCUMENTS

| | | |
|---|---|---|
| 0573653 | 12/1993 | European Pat. Off. . |
| 2480552 | 10/1981 | France . |
| 3729347 | 3/1988 | Germany . |
| 357199 | 3/1991 | Japan . |
| 3211284 | 9/1991 | Japan . |
| 9419921 | 9/1994 | WIPO . |

OTHER PUBLICATIONS

Search Report for European Appl. 95116716.2, mailed Feb. 5, 1996.

*Primary Examiner*—Mark H. Paschall
*Attorney, Agent, or Firm*—Renner, Otto, Boisselle & Sklar

[57] ABSTRACT

The microwave plasma torch of the invention includes: a vacuum container having an evacuating apparatus; a coaxial waveguide including an inner conductor and an outer conductor, a first end portion of the coaxial waveguide being connected with a microwave supplying apparatus for supplying a microwave and a second end portion of the coaxial waveguide being connected with the vacuum container, thereby introducing the microwave supplied from the microwave supplying apparatus into the vacuum container along a waveguide axis of the coaxial waveguide; and a gas supplying apparatus for injecting a gas into the vacuum container along a plurality of injection axes. In the microwave plasma torch, at least two of the plurality of injection axes do not cross the waveguide axis in the second end portion, and do not exist in a plane vertical to the waveguide axis, and a ratio of a diameter of the inner conductor to a diameter of the outer conductor in a vicinity of the second end portion decreases from the first to the second end portion along the waveguide axis.

18 Claims, 14 Drawing Sheets

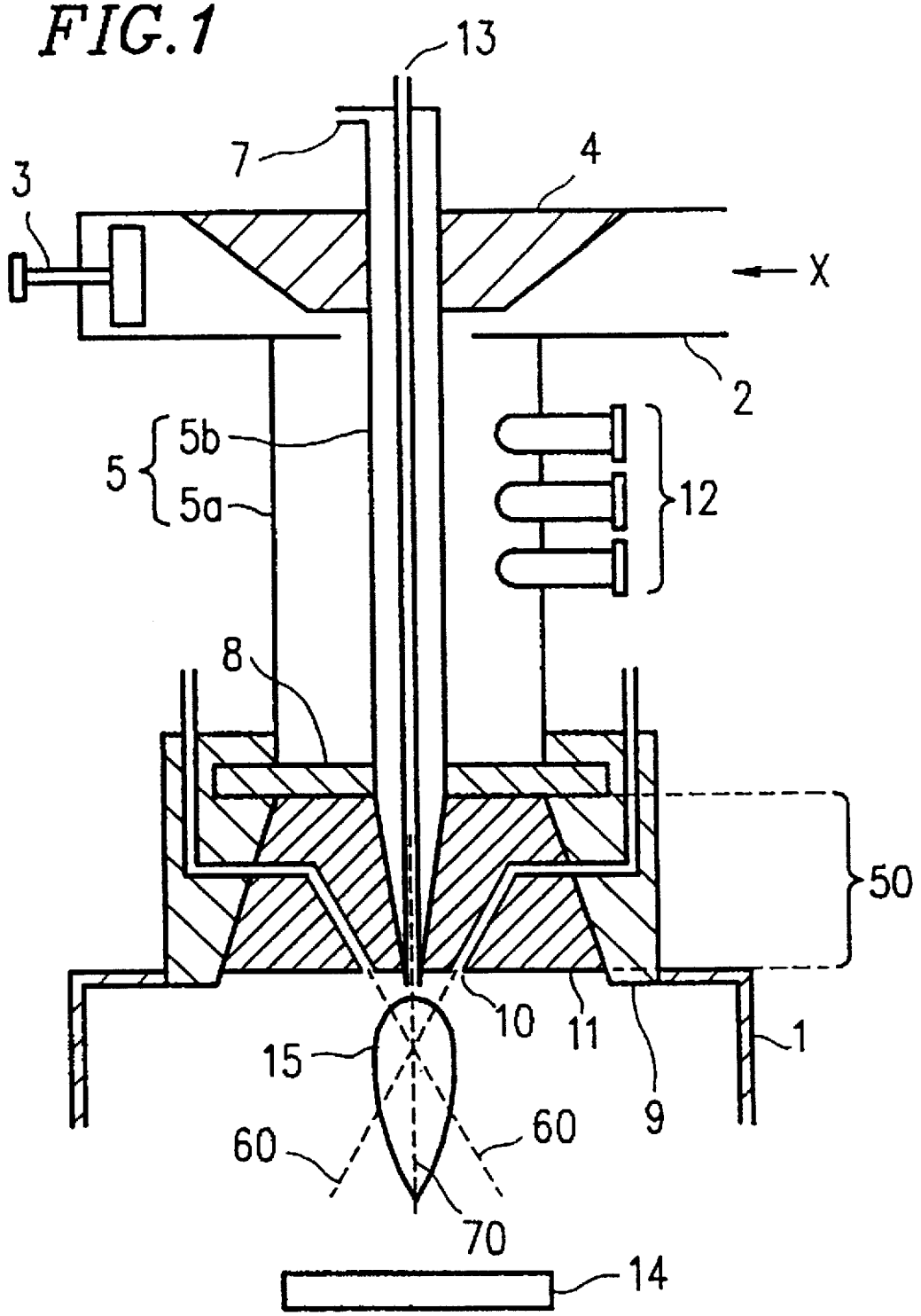

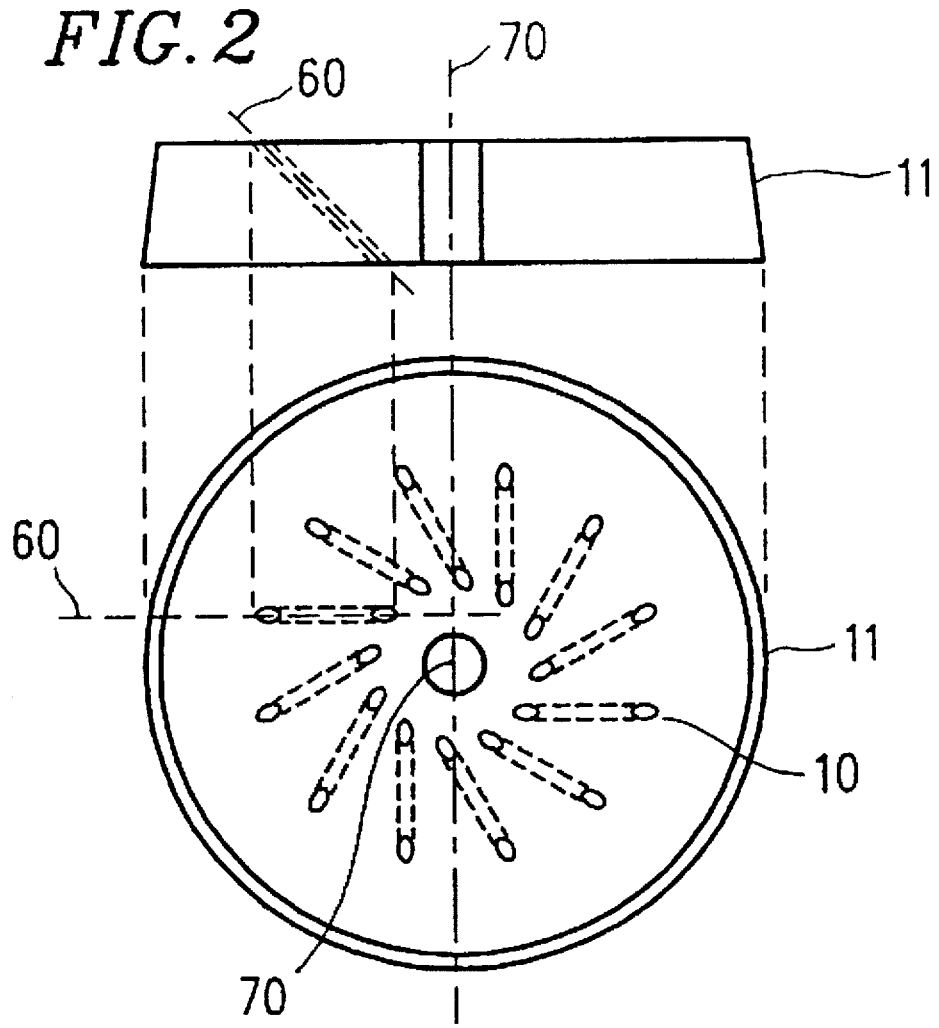

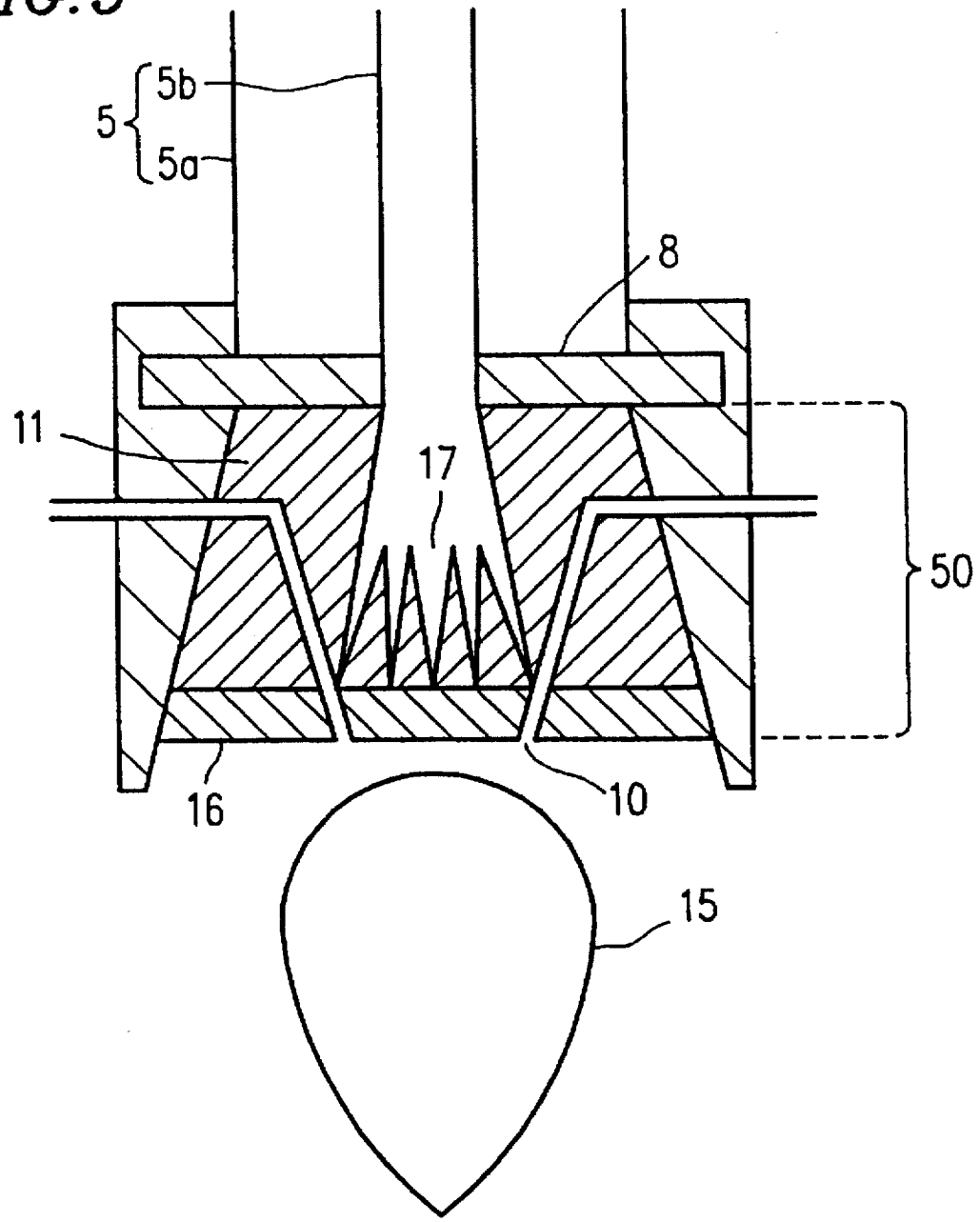

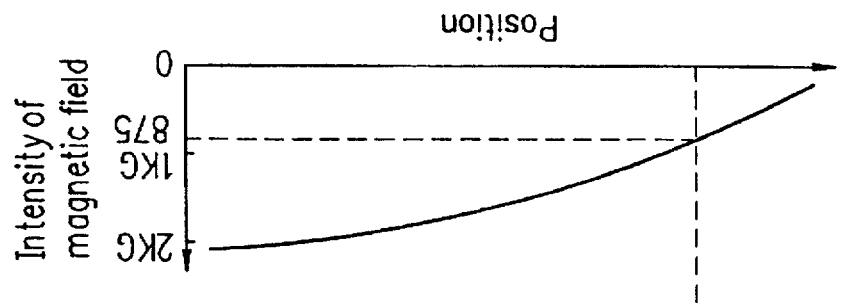
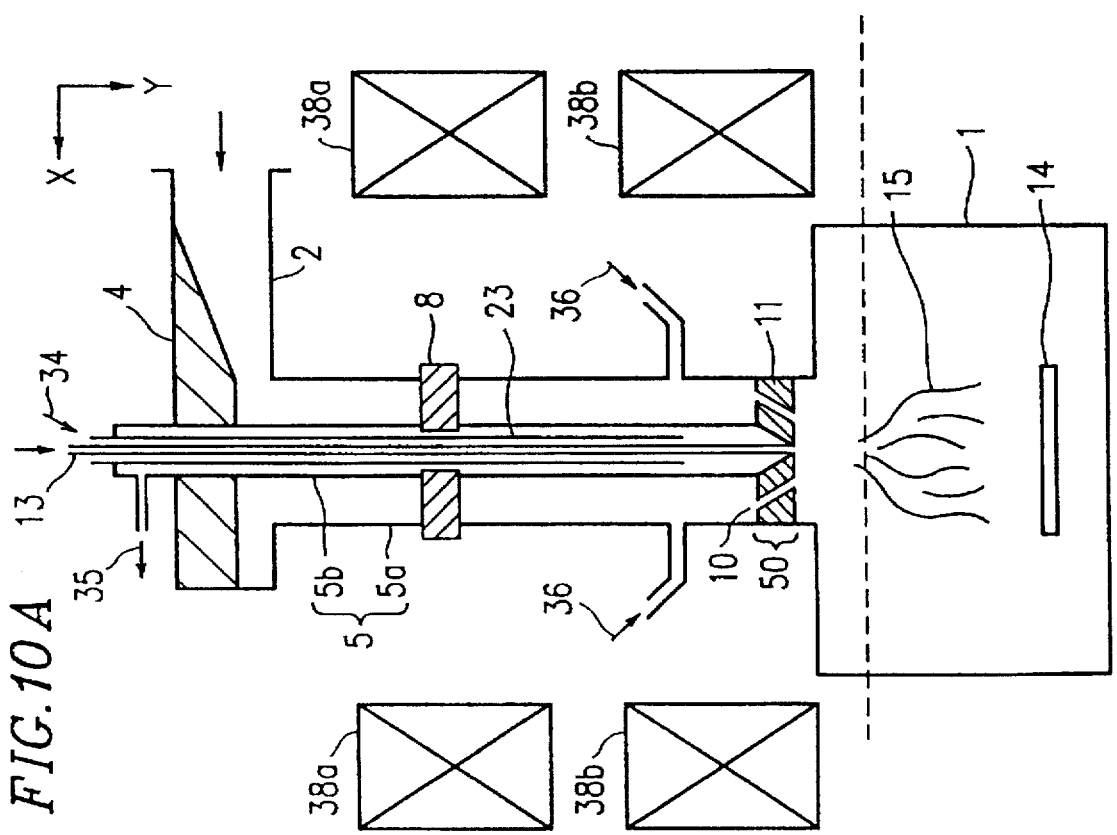
FIG.10A
FIG.10B

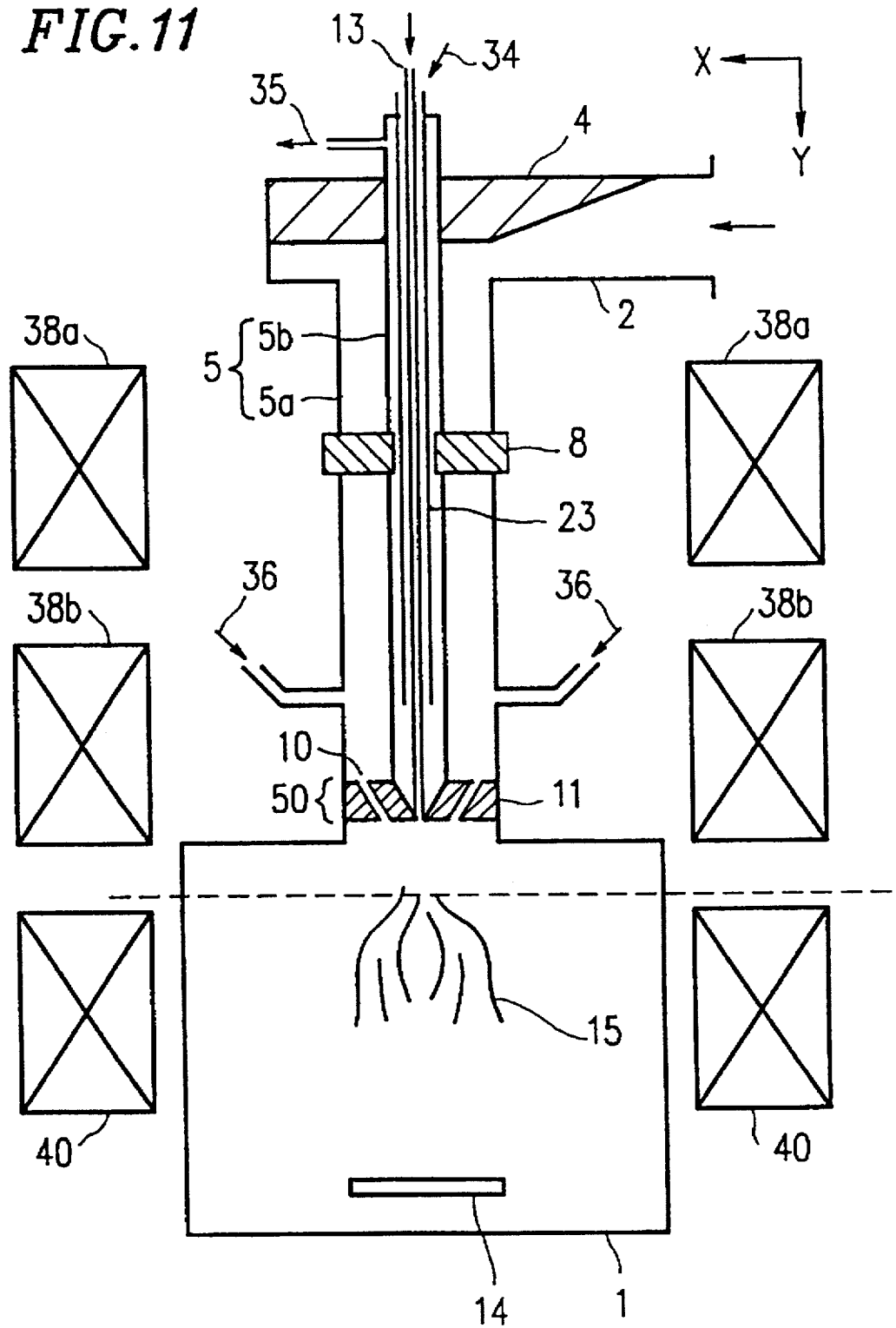

Direction of magnetic field

Direction of magnetic field

MICROWAVE PLASMA TORCH HAVING DISCRETELY POSITIONED GAS INJECTION HOLES AND METHOD FOR GENERATING PLASMA

BACKGROUND OF THE INVENTION

1. Field of the Invention

The present invention relates to a microwave plasma torch and a method for generating plasma. More specifically, the present invention relates to a microwave plasma torch a method for generating plasma for depositing a film made of a material having a high melting point or a crystalline thin film at high velocity and with high purity.

2. Description of the Related Art

A conventional plasma torch may be roughly classified as either a low-output plasma torch for spectral analysis or a high-output plasma torch used as a thermal energy source for welding, thermal spraying, cutting by melting and the like. However, if a conventional plasma torch is classified based on a method for generating plasma, a conventional plasma torch can be classified as follows: a plasma torch utilizing direct current (DC) arc discharge; a plasma torch utilizing inductively coupled radio frequency (hereinafter simply referred to as an "RF"; the frequency is in an approximate range of 4 MHz to 13.56 MHz) discharge; or a plasma torch utilizing microwave (the frequency is approximately 2.45 GHz).

In a conventional plasma torch utilizing DC arc discharge, the electrodes used therein are adversely etched. However, as long as high-density and high-temperature plasma is used as the thermal source, no problems are caused. Since arc discharge is not generated between electrodes in a plasma torch utilizing an inductively coupled RF discharge, a plasma flame having a reduced amount of impurity mixed therein can be formed. Nevertheless, in order to maintain the discharge under a high pressure, such as exceeding 100 Torr, as necessary for forming thermal plasma, a power as high as several hundreds of kW is required. In addition, it is necessary to protect a glass tube provided inside an induction coil from generated plasma by using a gaseous flow so as to prevent the contact between the induction coil and the plasma.

As compared with these two conventional technologies, a microwave plasma torch has the following features (a) to (c). That is to say, (a) discharge can be generated without using an electrode; (b) even under a high pressure exceeding 100 Torr, discharge can be maintained at a lower power consumption as compared with an RF discharge method by about two digits; and (c) since it is not necessary to provide an induction coil and a glass tube, a microwave plasma torch unit can be formed as a small-sized unit. Therefore, by arranging a plurality of such units, large-scale processing can be performed. Since a microwave plasma torch has such features, the microwave plasma torch is expected to be applicable not only to thermal plasma processing technologies, but also to technologies for processing a thin film material with a high purity.

A conventional microwave plasma torch is disclosed, for example, in Japanese Laid-Open Patent Publication No. 3-57199. In the plasma torch disclosed in the patent publication, the diameter of the outer conductor is set to be small at the end of a coaxial waveguide for propagating a microwave. In such a configuration, an electric field is concentrated at the end portion of the coaxial waveguide, thereby generating arc discharge.

The conventional microwave plasma torch, however, has the following problems. First, since a part of the inner and outer conductors is disadvantageously etched by the arc discharge generated therein, the elements constituting the etched part of the inner and outer conductors are undesirably mixed into the generated plasma as an impurity. In addition, a reduction in the diameter of the outer conductor is equivalent to a decrease in the impedance at the end of the coaxial waveguide. As a result, since the electric power is reflected and absorbed at the end of the coaxial waveguide, the impedance cannot be satisfactorily matched and it is difficult to stably maintain the discharge. Furthermore, at a point where a gaseous flow introduced along a circumferential direction is confluent with a gaseous flow introduced along a radial direction, a turbulent flow is likely to be generated, so that it is difficult to obtain a stable plasma flame.

SUMMARY OF THE INVENTION

The microwave plasma torch of the invention includes: a vacuum container having an evacuation means; a coaxial waveguide including an inner conductor and an outer conductor, a first end portion of the coaxial waveguide being connected with a microwave supplying means for supplying a microwave and a second end portion of the coaxial waveguide being connected with the vacuum container, thereby introducing the microwave supplied from the microwave supplying means into the vacuum container along a waveguide axis of the coaxial waveguide; and a gas supplying means for injecting a gas into the vacuum container along a plurality of injection axes. In the microwave plasma torch, at least two of the plurality of injection axes are located at torsional positions with the waveguide axis in the second end portion, and do not exist in a plane vertical to the waveguide axis, and a ratio of a diameter of the inner conductor to a diameter of the outer conductor in a vicinity of the second end portion decreases from the first to the second end portion along the waveguide axis.

In one embodiment, the gas supplying means includes a dielectric plate which is disposed between the first end portion and the second end portion and includes a plurality of gas injection holes for injecting the gas into the vacuum container along the plurality of injection axes.

In another embodiment, the dielectric plate has heat-resistance.

In still another embodiment, all of the plurality of injection axes are located at torsional positions with the waveguide axis and do not exist in the plane vertical to the waveguide axis.

In still another embodiment, a top end portion of the inner conductor in a vicinity of the second end portion is covered with a heat-resistant dielectric plate.

In still another embodiment, the dielectric plate contains the same components as those of a reactant material contained in the gas.

In still another embodiment, the inner conductor includes at least one gas injection hole for injecting a gas in the second end portion.

In still another embodiment, the inner conductor is more protrudent than the outer conductor into the vacuum container in the second end portion.

In still another embodiment, the second end portion of the inner conductor is divided into a plurality of branches.

In still another embodiment, the microwave plasma torch further includes a gradient magnetic field generation means for generating a magnetic field having an intensity gradually decreasing from the first end portion to the second end portion along the waveguide axis.

In still another embodiment, the gradient magnetic field generation means generates a magnetic field intense enough to cause an electron cyclotron resonance (ECR) state at a point away from the second end portion of the coaxial waveguide in the vacuum container.

In still another embodiment, the microwave plasma torch further includes a rotational magnetic field generation means for generating a rotational magnetic field in the vacuum container.

In still another embodiment, the microwave plasma torch includes a plurality of the coaxial waveguides and a plurality of the gas supplying means.

The microwave plasma torch according to another aspect of the present invention includes a vacuum container having an evacuation means, and a coaxial waveguide including an inner conductor and an outer conductor, a first end portion of the coaxial waveguide being connected with a microwave supplying means for supplying a microwave and a second end portion of the coaxial waveguide being connected with the vacuum container, thereby introducing the microwave supplied from the microwave supplying means into the vacuum container along a waveguide axis of the coaxial waveguide. In the microwave plasma torch, the inner conductor includes at least one gas injection hole for injecting a gas and is more protrudent than the outer conductor into the vacuum container in the second end portion.

According to still another aspect of the present invention, a method for generating plasma in a vacuum container is provided. The method includes the steps of introducing a microwave into the vacuum container along a first axis, and generating a spiral gaseous flow having a velocity vector parallel to the first axis in a space inside the vacuum container where the plasma is generated.

In one embodiment, the method for generating plasma further includes a step of generating a magnetic field having an intensity decreasing in a direction along the first axis toward the vacuum container.

In another embodiment, the method for generating plasma further includes a step of generating a rotational magnetic field in the vacuum container.

Thus, the invention described herein makes possible the advantage of providing a microwave plasma torch and a method for generating plasma in which the constituent elements of the plasma torch are not mixed into the plasma as an impurity, thereby depositing a crystalline thin film and the like with a high purity.

This and other advantages of the present invention will become apparent to those skilled in the art upon reading and understanding the following detailed description with reference to the accompanying figures.

BRIEF DESCRIPTION OF THE DRAWINGS

FIG. 1 is a cross-sectional view showing a configuration for a microwave plasma torch according to a first example of the present invention.

FIG. 2 shows an exemplary configuration for a heat-resistant dielectric plate.

FIG. 7A is a cross-sectional view showing gas injection holes provided through an inner wall of an outer conductor 5a, while FIG. 7B is a cross-sectional view showing gas injection tubes provided through the inner wall of the outer conductor 5a.

FIG. 9 is a cross-sectional view showing a configuration for a microwave plasma torch according to a third example of the present invention.

FIG. 10A is a cross-sectional view showing a configuration for a microwave plasma torch according to a fourth example of the present invention, while FIG. 10B is a graph showing an intensity of the magnetic field on a center axis of the inner conductor 5b of the coaxial waveguide 5.

FIG. 11 is a cross-sectional view showing a configuration for a microwave plasma torch according to a fifth example of the present invention.

DESCRIPTION OF THE PREFERRED EMBODIMENTS

Figure 3A:
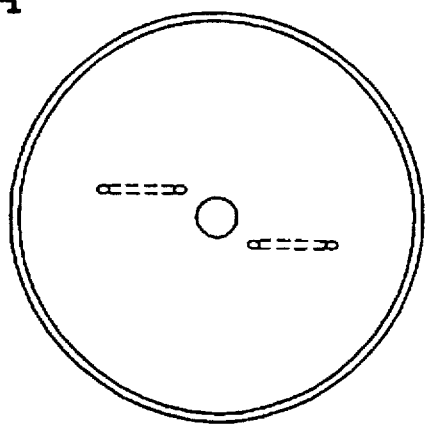
FIGS. 3A to 3C show other exemplary configurations for the heat-resistant dielectric plate.

Hereinafter, a microwave plasma torch and a method for generating plasma according to the present invention will be described by way of illustrative examples with reference to the accompanying drawings. In the drawings, the same reference numerals denote the same components throughout the following examples.

EXAMPLE 1

FIG. 1 is a cross-sectional view showing a configuration for a microwave plasma torch according to a first example of the present invention. A substrate 14 to be processed is held in a vacuum container 1. "Processing" herein includes, for example, a deposition process step and a surface treatment in semiconductor fabrication processes. The vacuum container 1 is provided with an evacuating apparatus (not shown), thereby obtaining a vacuum having a pressure of about $10^{-5}$ Torr. In the following Examples 1 to 7, the pressure is lowered to about $10^{-5}$ Torr before performing a plasma processing. Thereafter, when a plasma flame is generated, a reactant gas and a discharge gas are injected as described later. Accordingly, the pressure inside the vacuum container 1 during the plasma processing becomes about 100 to 150 Torr.

A rectangular waveguide 2 propagates a microwave supplied from a microwave generator (not shown) along the direction indicated by the arrow X in FIG. 1. The frequency of the microwave is 2.45 GHz, for example. A rectangular waveguide type No. WRJ-18 is used as the rectangular waveguide 2. A plunger 3 terminates the rectangular waveguide 2 at a desired impedance, thereby preventing the generation of a loss in the end portion of the rectangular waveguide 2. A ridge 4 transforms the 20 mode of the microwave, thereby matching the impedance in a junction portion between the rectangular waveguide 2 and the coaxial waveguide 5. An outer conductor 5a and an inner conductor 5b constitute a coaxial waveguide 5 (type No. WX-39 D is used for example). The inner conductor 5b has a vacant portion therein, and a cooling-water tube 7 is provided inside the inner conductor 5b for circulating cooling water.

The microwave input to the coaxial waveguide 5 is transmitted through a dielectric plate 8 and supplied to the vacuum container 1. The dielectric plate 8 is a plate made of a material transmitting a microwave, e.g., alumite, and contributes to maintaining the air-tightness of the vacuum container 1. The specific dielectric constant of the dielectric plate 8 is preferably in a range of 1 to 9. This is because, if the impedance of the coaxial waveguide is 50 Ω, then the ratio of the diameter of the inner conductor to that of the outer conductor becomes large and a practical coaxial waveguide cannot be obtained.

The coaxial waveguide 5 is connected with the vacuum container 1 in an end portion 9 of the outer conductor 5a. In a taper portion 50 located in the vicinity of the end portion 9 of the outer conductor 5a, the diameter of the inner conductor 5b gradually decreases and that of the outer conductor 5a gradually increases in the direction from the dielectric plate 8 toward the vacuum container 1. In other words, the ratio of the diameter of the inner conductor 5b of the coaxial waveguide 5 to the diameter of the outer conductor 5a thereof monotonically decreases in the taper portion 50, thereby preventing the impedance of the coaxial waveguide 5 with respect to the microwave from abruptly changing in the vicinity of the end portion 9 of the outer conductor 5a. As a result, the generation of a reflected wave in the taper portion 50 can be prevented and the microwave can be supplied to the space inside the vacuum container 1 at a low loss. In addition, the impedance can be easily matched. A stub tuner 12 matches the impedance in the taper portion 50. The microwave is propagated along an axis of the waveguide, as described later, and then radiated into the space within the vacuum container 1.

More specifically, the impedance of the coaxial waveguide 5 is 50 Ω at a point where the dielectric plate 8 is provided, and 138 Ω in the end portion 9 of the outer conductor 5a (if the diameter of the inner conductor 5b is assumed to be 0, then the coaxial waveguide 5 can be regarded as a cylindrical waveguide). The dielectric plate 8 is separated from the end portion 9 of the outer conductor 5a by a distance of 80 mm, which is the length of the taper portion 50, and the impedance increases substantially monotonically from 50 Ω to 138 Ω in the portion between the dielectric plate 8 and the end portion 9 of the outer conductor 5a.

A heat-resistant dielectric plate 11 is disposed in the vicinity of the connection portion between the coaxial waveguide 5 and the vacuum container 1. In the present invention, a "heat resistant" dielectric plate is assumed to have a melting point of 3000° C. or higher. This heat-resistant dielectric plate 11 is made, for example, of boron nitride. The heat-resistant dielectric plate 11 is not cracked or deformed owing to the heat resistance thereof, even if the heat-resistant dielectric plate 11 is disposed near plasma at a high temperature. Accordingly, gas injection holes 10 can be provided for the heat-resistant dielectric plate 11. A discharge gas is injected through the gas injection holes 10. A "discharge gas" herein refers to a gas for generating and maintaining a discharge, and is also referred to as a "carrier gas" Hydrogen gas is used as the discharge gas, for example.

FIG. 2 shows a configuration for the heat-resistant dielectric plate 11. As shown in FIG. 2, a plurality of gas injection holes 10 (twelve holes in this example) are provided in the heat-resistant dielectric plate 11 so as to be axisymmetric with respect to the center axis of the inner conductor 5b. In this specification, the center axis of the inner conductor 5b at the taper portion 50 of the coaxial waveguide 5 will be called a "waveguide axis 70 of the coaxial waveguide 5" for defining the propagation direction of the microwave. When the center axis of the inner conductor 5b is curved at the taper portion 50, the waveguide axis 70 is defined to be the center axis of the inner conductor 5b at the end portion of the coaxial waveguide 5. The axis along which the gas is injected immediately after passing the gas injection holes 10 will be called an "injection axis 60". All of the injection axes 60 as shown in FIG. 2 are located at "torsional" positions with the waveguide axis 70 and do not exist in a plane vertical to the waveguide axis 70. A "torsional" positional relationship herein refers to the relationship between two straight lines which are not parallel to each other but do not cross each other, either. The diameter of each of the gas injection holes 10 is about 0.5 mm. The discharge gas injected through the gas injection holes 10 flows through the vacuum container 1 towards the vicinity of the substrate 14 while forming spiral fluxes without generating a turbulent flow. The discharge gas flowing in a spiral shape is turned into plasma by a radio frequency electric field caused by the microwave, thereby forming a plasma flame 15. Since a turbulent flow is not generated in the discharge gas, a uniform and stable discharge can be maintained over a wide space, so that a uniform and stable plasma flame can be obtained. Accordingly, a large-scale substrate can be processed uniformly.

The number of the gas injection holes 10 is not limited to twelve, but may be equal to or greater than two. If at least two of the plurality of injection axes are located at torsional positions with the waveguide axis in the second end portion, and do not exist in a plane vertical to the waveguide axis, the above-mentioned advantage is obtained because the discharge gas forms a spiral shape with little turbulent flow. Preferably, however, all of the plurality of injection axes are located at torsional positions with the waveguide axis and, do not exist in the plane vertical to the waveguide axis, resulting less turbulent flow in the gas flowing in a spiral shape.

The inner conductor 5b has a central gas inlet port 13. A reactant gas is introduced through the central gas inlet port 13 into the core of the plasma flame 15 at a high temperature. As a result, the reactant gas is efficiently decomposed and a substrate can be processed at a high rate. A "reactant gas" herein refers to a gas used for the surface treatment (e.g., deposition) of a substrate. In the case of depositing a silicon film, for example, monosilane ($SiH_4$) gas is used as the reactant gas.

When the plasma torch according to the first example of the present invention is operated under the conditions where the flow rate of hydrogen gas is 2000 $cm^3$ /minute; the pressure of the environment inside the vacuum container 1 is 150 Torr; and the microwave output from the microwave generator is 1 kW or less, a high-purity polycrystalline silicon thin film can be uniformly deposited on the substrate 14.

Since the ratio of the diameter of the inner conductor 5b of the coaxial waveguide 5 to the diameter of the outer conductor 5a thereof monotonically decreases in the taper portion 50, the microwave power is not reflected until the microwave reaches the connection portion between the coaxial waveguide 5 and the vacuum container 1, and therefore is transmitted at a high efficiency and with the impedance satisfactorily matched. As a result, it is possible to eliminate an arc discharge caused by a concentrated electric field, and prevent the elements constituting the waveguide and the like from being mixed as an impurity.

The microwave is transmitted through the space inside the vacuum container 1 as an electric wave, so that plasma can be generated outside of the coaxial waveguide 5. As a result, a thin film with a higher purity can be deposited.

Although a dielectric plate with no heat-resistance can be used instead of the heat-resistant dielectric plate 11, preferably the dielectric plate has heat-resistance since the high-temperature plasma flame exists in the vicinity of the dielectric plate.

Figure 3B:
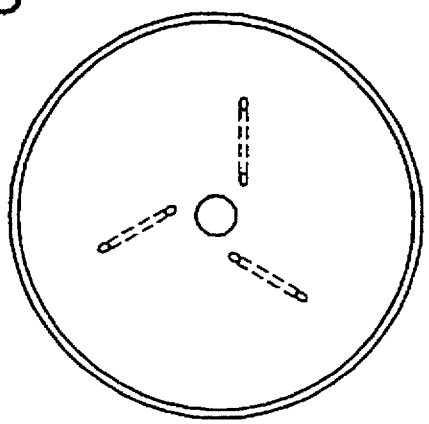
Figure 3C:
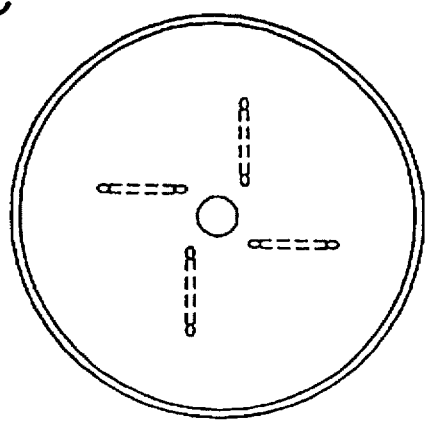

FIGS. 3A to 3C show other configurations for the heat-resistant dielectric plate 11. The heat-resistant dielectric plate 11 is not limited to that shown in FIG. 2, but can include the holes 10 as shown in FIGS. 3A to 3C. In the gas injection holes 10 shown in FIGS. 3A to 3C, the plurality of injection axes are located at torsional positions with the waveguide axis in the second end portion, and do not exist in a plane vertical to the waveguide axis.

Figure 4B:
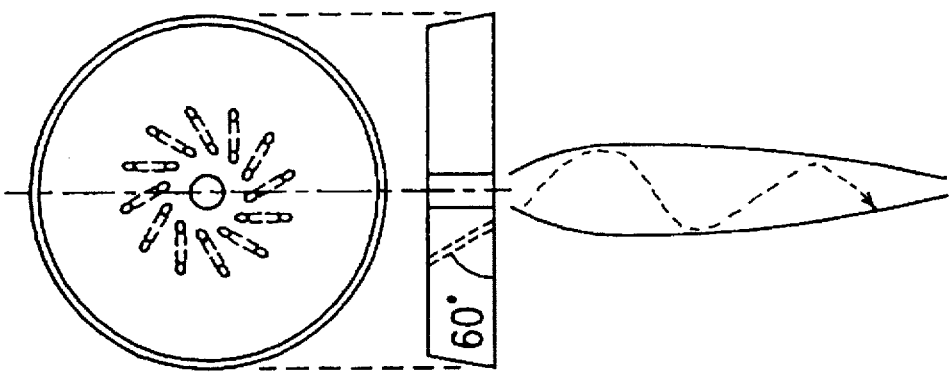
FIGS. 4A and 4B illustrate the influence of an injection axis and an injection angle of a gas upon the shape of a plasma flame.
Figure 4A:
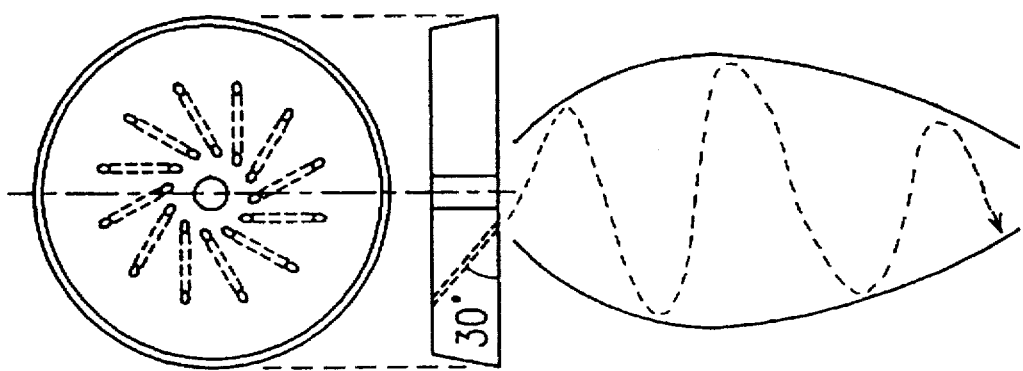

FIGS. 4A and 4B illustrate the influence of an angle formed between the injection axis of the gas and the plane vertical to the waveguide axis (or the plane of the heat-resistant dielectric plate) upon the shape of the plasma flame (hereinafter, the angle will be referred to as an "injection angle"). In FIGS. 4A and 4B, the distances between the gas injection holes on the plane of the heat-resistant dielectric plate 11 facing the vacuum container 1 and the center of the inner conductor 5b (hereinafter, the distance will be referred to as an "injection radius") are equal, but the gas can be injected at different injection angles. More specifically, the injection angle is 30 degrees in FIG. 4A (equal to that of the above-described plasma torch), while the injection angle is 60 degrees in FIG. 4B. In the case of using the gas injection holes shown in FIG. 4B, the time during which the gas flows through the plasma becomes shorter than the case where the gas is injected through the gas injection holes shown in FIG. 4A, so that the gas is heated by the plasma in a shorter period of time. That is to say, by varying the injection angle of the gas, the heating time of the gas can be varied. Therefore, by varying the injection angle of the gas, it is possible to control the extent to which the gas is decomposed and dissociated depending upon the kind of the gas to be processed. For example, in the case of using this plasma torch for depositing a film, it is possible to control the extent to which the gas is decomposed by varying the injection angle of the gas, so that the characteristics of the resulting film can also be controlled. The injection angle is preferably in an approximate range of 30 to 60 degrees for forming a gaseous flow with a reduced turbulent flow.

Figure 5B:
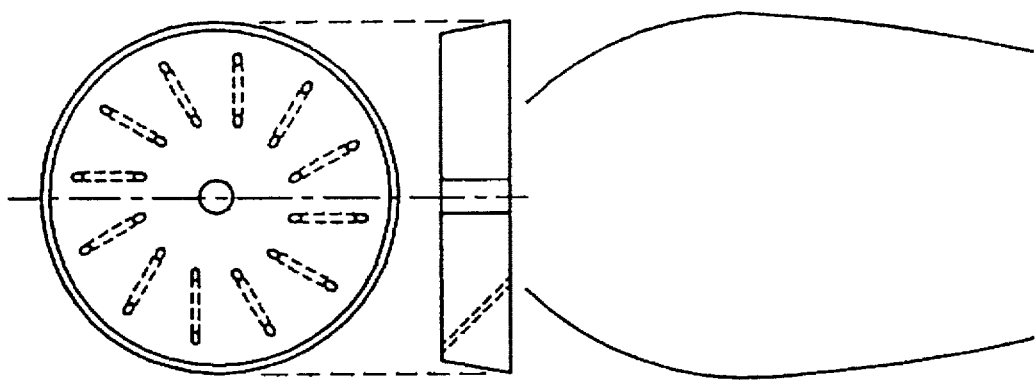
FIGS. 5A and 5B illustrate the influence of an injection radius of the gas upon the shape of the plasma flame.
Figure 5A:
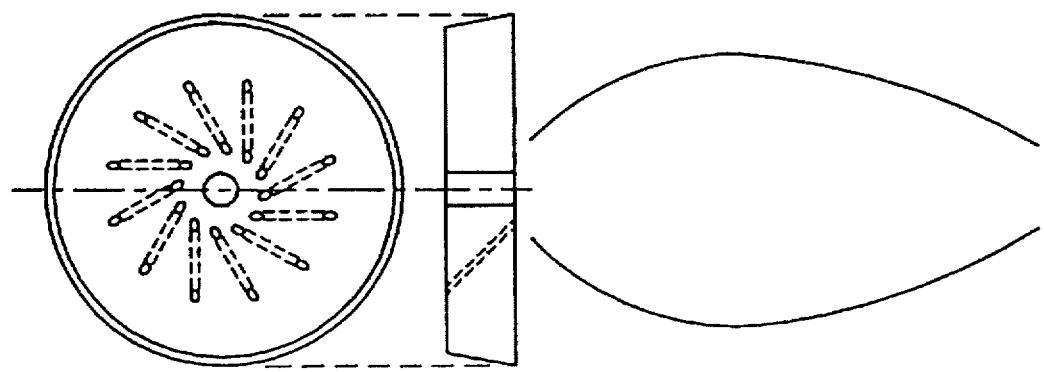

FIGS. 5A and 5B illustrate the influence of an injection radius of the gas upon the shape of the plasma flame. In FIGS. 5A and 5B, the injection angles of the gas are equal (30 degrees in both cases), but the injection radii of the gas are different. More specifically, the injection radius in FIG. 5B is larger than the injection radius in FIG. 5A, and the diameter of the plasma flame shown in FIG. 5B is larger than the diameter of the plasma flame shown in FIG. 5A. That is to say, by varying the injection radius of the gas, the diameter of the plasma flame can be varied, thereby varying the area to be processed by the plasma. For example, in the case of processing a substrate with plasma, a large area of the substrate can be uniformly processed by setting the injection radius to be large as shown in FIG. 5B. To the contrary, by setting the injection radius to be small as shown in FIG. 5A, a small area of the substrate can be processed with high-density plasma.

Figure 6:
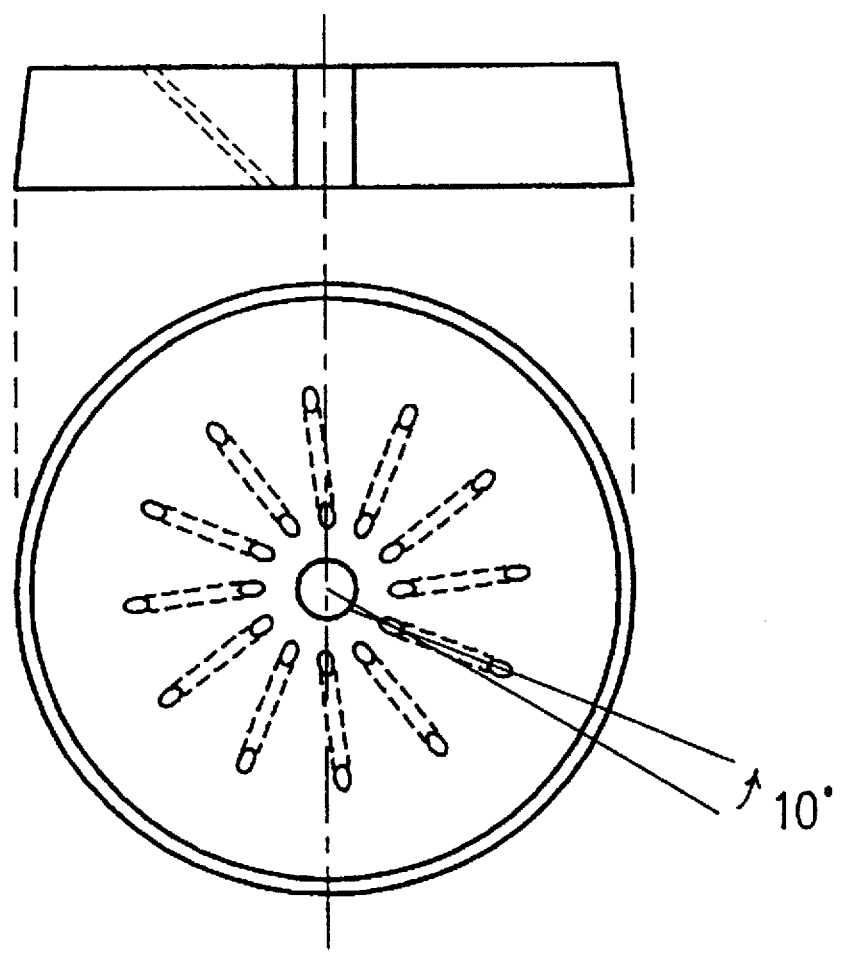
FIG. 6 shows a configuration for gas injection holes in which a torsion angle is set to be 10 degrees.

FIG. 6 shows still another configuration for the gas injection holes 10 in which the angle formed between the radius of the heat-resistant dielectric plate 11 and the injection axis of the gas (hereinafter, the angle will be referred to as a "torsion angle") is set to be 10 degrees. In the foregoing description, the torsion angle was 30 degrees. In the case of using the injection holes 10 shown in FIG. 6, the velocity vector of the injected gas along the radial direction becomes dominant, so that the gas fluxes come into contact with each other very frequently and a turbulent flow is generated. As a result, the plasma flame becomes unstable. If the torsion angle is set to be 90 degrees (not shown), then the velocity vector of the injected gas along the circumferential direction becomes dominant, so that the spiral fluxes are not formed and a turbulent flow is generated. As a result, the plasma flame also becomes unstable. In order to generate a stable plasma flame, the torsion angle is required to be in the range of about 30 to about 60 degrees.

Figure 7A:
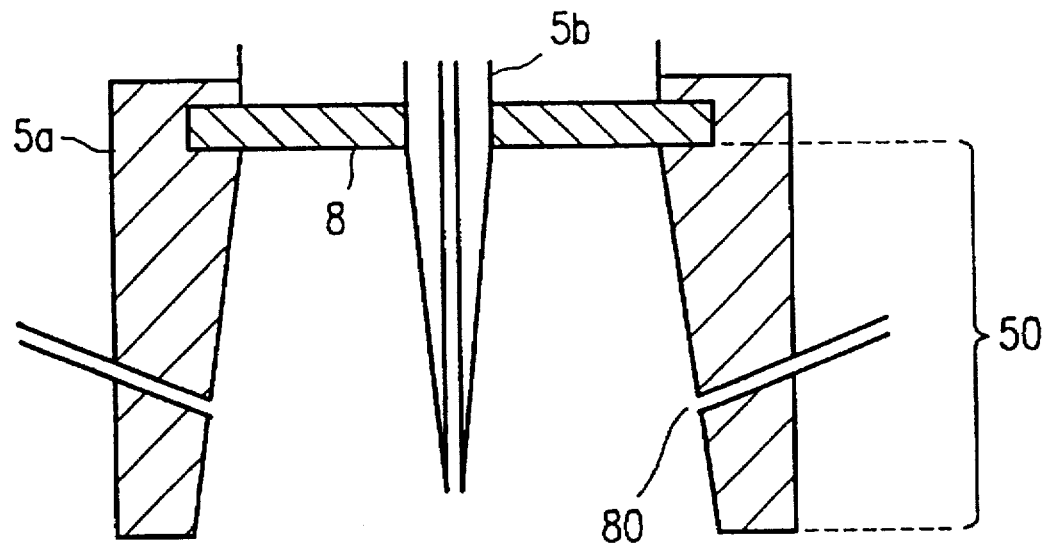
Figure 7B:
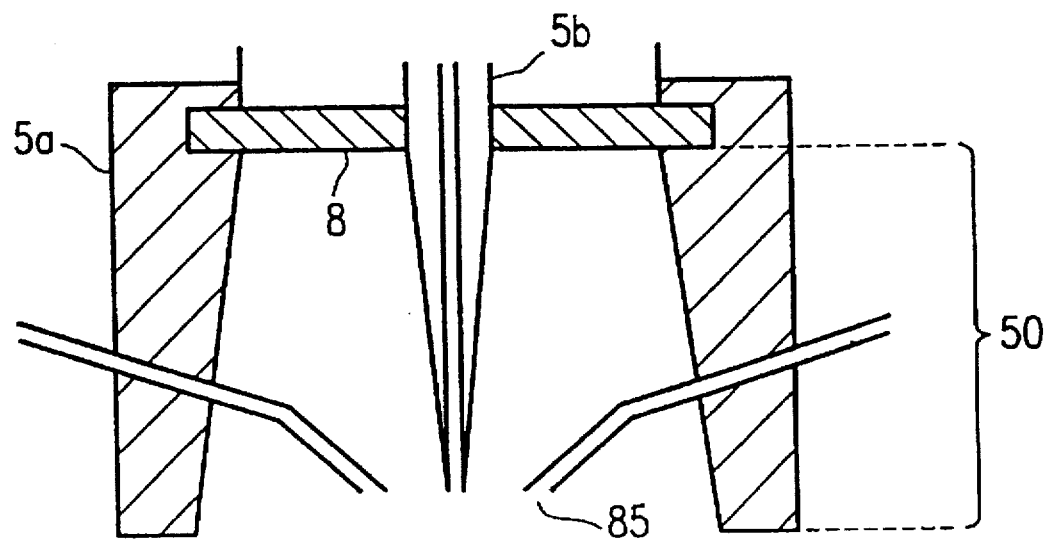

In the foregoing description, the injection direction of the gas is determined by providing the gas injection holes 10 for the heat-resistant dielectric plate 11. Alternatively, the gas can be injected without using such a heat-resistant dielectric plate provided with gas injection holes. FIGS. 7A and 7B are enlarged views showing the portion near the taper portion 50 of a gas injection structure where a heat-resistant dielectric plate is not provided. The remaining parts not shown in FIGS. 7A and ? B are the same as those shown in FIG. 1.

FIG. 7A shows gas injection holes 80 provided through the inner wall of the outer conductor 5a, while FIG. 7B shows gas injection tubes 85 provided through the inner wall of the outer conductor 5a. In the gas injection structures shown in FIGS. 7A and 7B, the injection axes are located at torsional positions with respect to the waveguide axis and do not exist in the plane vertical to the waveguide axis, so that the gas injected along these axes forms spiral fluxes. If the gas injection holes 80 are disposed as shown in FIG. 7A, the injection radius becomes large so that a large plasma flame can be formed. On the other hand, if the gas injection tubes 85 are disposed as shown in FIG. 7B, then the gas can be injected in the vicinity of the top end portion of the inner conductor 5b.

The gas injection structures shown in FIGS. 7A and 7B will be compared with the gas injection structure using a heat-resistant dielectric plate below. In the structure shown in FIG. 7A, the gas injection holes are located at positions away from the center axis of the inner conductor 5b, so that the gas fluxes are spread and a turbulent flow is generated in the center portion of the plasma flame. In this case, if the velocity of the flowing gas fluxes is set to be high, then it is possible to prevent the gas fluxes from spreading. However, the gas is heated by the microwave for a shorter period of time, and the resulting plasma flame becomes smaller. Accordingly, the plasma becomes unstable. Consequently, it is preferable to use a structure having a heat-resistant dielectric plate rather than the structure shown in FIG. 7A. In the case of making the gas injection tubes 85 of a metallic material such as SUS, it is necessary to prevent the generation of an arc discharge between the gas injection tubes 85 and the inner conductor 5b. Therefore, the gas injection tubes 85 are preferably made of a dielectric material. It is preferable to use a structure having a heat-resistant dielectric plate rather than the structure shown in FIG. 7B in view of the simple configuration of the former structure.

Although the discharge gas is injected through the gas injection holes 10 and the reactant gas is injected through the central gas inlet port 13 in the first example, the gas to be injected and the gas injection holes to inject the gas are not limited to this configuration. For example, the discharge gas may be injected through the central gas inlet port 13 and the reactant gas may be injected through the gas injection holes 10. The discharge gas and the reactant gas may be mixed before injection into the vacuum container and then the mixed gas may be injected through both the gas injection holes 10 and the central gas inlet port 13.

EXAMPLE 2

Figure 8:
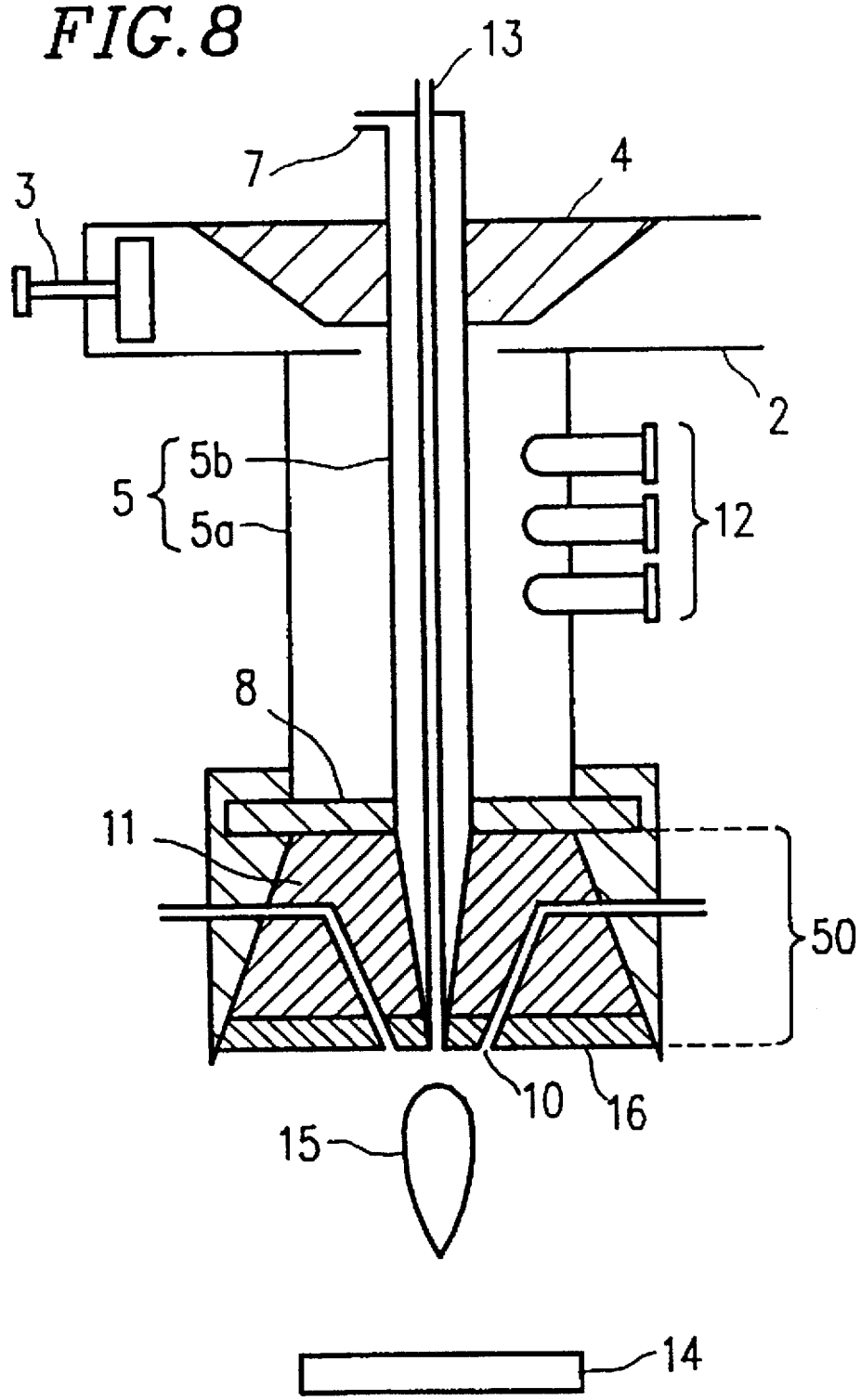
FIG. 8 is a cross-sectional view showing a configuration for a microwave plasma torch according to a second example of the present invention.

FIG. 8 is a cross-sectional view showing a configuration for a microwave plasma torch according to a second example of the present invention. As shown in FIG. 8, a heat-resistant dielectric plate 11 and a plate-shaped protective dielectric plate 16 are provided in the vicinity of the taper portion 50. The protective dielectric plate 16 disposed closer to the plasma flame 15 contains the same components as those contained in the reactant material in the gas to be supplied. The top end portion of the inner conductor 5b is further covered with the protective dielectric plate 16. In other words, the top end portion of the inner conductor 5b does not protrude from the surface of the protective dielectric plate 16.

This configuration is particularly effective in the case where the flow rate of the gas injected through the gas injection holes 10 is 1200 cm$^3$/minute or less. In the case where the flow rate of the gas for a unit period of time is small and the microwave output exceeds 2 kW, the plasma flame becomes large, so that the top end portion of the inner conductor 5b possibly comes into contact with the plasma flame 15. However, if the top end portion of the inner conductor 5b is covered with the protective dielectric plate 16 containing the same components as those contained in the reactant material of the gas, an impurity is not mixed into the plasma flame 15 even if the plasma flame 15 comes into contact with the protective dielectric plate 16. As a result, a high purity film can be deposited. In the case where the reactant gas contains $SiH_4$, a high purity silicon plate made of monocrystalline silicon or polycrystalline silicon can be used as the protective dielectric plate 16. Also, the protective dielectric plate 16 preferably has heat resistance.

EXAMPLE 3

FIG. 9 is a cross-sectional view showing a configuration for a microwave plasma torch according to a third example of the present invention. As shown in FIG. 9, the top end portion of the inner conductor 5b has a plurality of branches in the vicinity of the taper portion 50. The microwave radiated from the branched top end portion 17 toward the space of the vacuum container 1 is not radiated locally as in the first example, but radiated at a wide solid angle. As a result, a larger plasma flame is formed and the plasma torch of this example is suitable for processing a large-scale substrate.

EXAMPLE 4

FIG. 10A is a cross-sectional view showing a configuration for a microwave plasma torch according to a fourth example of the present invention, while FIG. 10B is a graph showing an intensity of the magnetic field on the center axis of the inner conductor 5b of the coaxial waveguide 5. A substrate 14 to be processed is held in a vacuum container 1.

A rectangular waveguide 2 receives the microwave supplied from a microwave generator (not shown) and propagates the microwave through a ridge 4 for varying the thickness of the waveguide to the coaxial waveguide 5. The coaxial waveguide 5 includes a cylindrical outer conductor 5a and a cylindrical inner conductor 5b. The outer conductor 5a and the inner conductor 5b commonly have a center axis. The inner conductor 5b is connected with a ridge 4, and the top end portion of the inner conductor 5b protrudes through the reverse surface of the rectangular waveguide 2. The outer conductor 5a is connected with the outer periphery of the rectangular waveguide 2. The rectangular waveguide 2 is herein used for introducing the microwave into the coaxial waveguide 5. Alternatively, other types of waveguides can also be used so long as the microwave can be introduced into the coaxial waveguide 5. The dielectric plate 8 provided for the outer conductor 5a and the inner conductor 5b maintains the vacuum inside the vacuum container 1.

In the taper portion 50, the diameter of the inner conductor 5b gradually decreases while the diameter of the outer conductor 5a gradually increases along the direction toward the vacuum container 1. That is to say, the ratio of the diameter of the inner conductor 5b of the coaxial waveguide 5 to the diameter of the outer conductor 5a thereof monotonically decreases in the taper portion 50, so that it is possible to prevent the generation of the reflected wave in the taper portion 50, and transmit the microwave to the space inside the vacuum container 1 at a low loss. Cooling water is filled from a cooling water inlet port 34 provided over the inner conductor 5b; flows through a water pipe 23 inside the inner conductor 5b; and flows out of a cooling water outlet port 35.

The outer conductor 5a is provided with gas inlet ports 36 below the dielectric plate 8. A heat-resistant dielectric plate 11 is provided in the taper portion 50 of the coaxial waveguide 5. The heat-resistant dielectric plate 11 is provided with gas injection holes 10 for obtaining the stability and the controllability of the gas plasma. The inner conductor 5b has a central gas inlet port 13 inside the water pipe 23. The reactant gas is introduced through the central gas inlet port 13 into the center of the plasma flame 15 at a high temperature. A reactant material can be injected through the central gas inlet port 13.

Solenoid coils 38a and 38b (inner diameter: 250 mm; outer diameter: 400 mm; height: 100 mm) are disposed outside the outer conductor 5a. By controlling the current flowing through the solenoid coils 38a and 38b, a gradient magnetic field can be generated from the upper portion of the torch. A "gradient magnetic field" herein refers to a magnetic field having an intensity monotonically increasing or decreasing along a direction.

Hereinafter, exemplary conditions for actually operating the microwave plasma torch having the above configuration and the plasma flame formed under the conditions will be described. First, the vacuum container 1 is evacuated to $10^{-5}$ Torr. Then, a DC current of 50 A is supplied to the solenoid coil 38a and a DC current of 20 A is supplied to the solenoid coil 38b. In such a case, the gradient magnetic field shown in FIG. 10B is generated. In the upper portion (on the side of the ridge 4) of the coaxial waveguide 5, the intensity of the magnetic field along the axis direction is 2 kG or more. On the other hand, the intensity of the magnetic field decreases along the axis direction of the coaxial waveguide 5 toward the lower portion (on the side of the vacuum container 1) of the coaxial waveguide 5. At a point which is 5 mm away from the heat-resistant dielectric plate 11 to the side of the substrate 14, the intensity of the magnetic field is 875 G. In such a case, argon gas is supplied through the central gas inlet port 13 at a flow rate of 1000 cm$^3$/minute, for example, so as to inject the gas into the vacuum container 1. In addition, argon gas is also supplied through the gas inlet ports 36 at a flow rate of 2500 cm$^3$/minute, so as to inject the gas in spiral shape through the gas injection holes 10. The pressure inside the vacuum container 1 is kept at 100 Torr. A microwave having a frequency of 2.45 GHz and a power of 2 kW is generated by a magnetron (not shown) and then supplied to the rectangular waveguide 2 with a size of 109 mm x 54.5 mm along the x-axis direction. The microwave in the TE (transverse electric wave)$_{10}$ mode input to the rectangular waveguide 2 is transformed into a microwave in the TEM (transverse electric and magnetic wave) mode by the ridge 4, and propagated through the coaxial waveguide 5 (inner diameter: 18 mm; outer diameter: 42 mm). Then, the microwave is passed through the dielectric plate 8 made of teflon and the heat-resistant dielectric plate 11 made of boron nitride, so as to be supplied into the vacuum container 1.

The microwave supplied into the vacuum container 1 ionizes the injected gas. In the case where a microwave having a frequency of 2.45 GHz is used and the intensity of the magnetic field is 875 G, the electrons are substantially in an electron cyclotron resonance (ECR) state even in a low vacuum region, and the density of the electrons is higher than the other regions. Accordingly, plasma is generated at a point where the intensity of the magnetic field is 875 G, and the plasma flame 15 radially extends toward the direction where the intensity of the magnetic field becomes weaker. An "ECR state" herein refers to a state where the period of the circular motion of the electrons caused by a magnetic field is equal to the frequency of an electromagnetic wave propagating through plasma. In this state, a resonance phenomenon is caused and the electrons are accelerated, so that the density of the electrons becomes high. Whether or not the electrons are in the ECR state depends only upon the frequency of the microwave and the intensity of the magnetic field. In this case, since the frequency of the microwave is 2.45 GHz, the state of the electrons becomes the ECR state if the intensity of the magnetic field is 875 G. The present inventors have confirmed based on the experimental results that the plasma flame 15 has been generated at a point about 5 mm away from the heat-resistant dielectric plate 11 provided in the opening of the coaxial waveguide 5 to the side of the substrate 14. In this example, the plasma can be generated at a point distant from the heat-resistant dielectric plate 11. Accordingly, in the case where the reactant gas and the reactant material are supplied through the central gas inlet port 13 and the reactant material is deposited or grown on the substrate 14, it is possible to prevent the elements composing a member of the plasma torch and the heat-resistant dielectric plate 11 from being mixed into the plasma as an impurity. As a result, a high purity reactant can be efficiently produced.

On the other hand, if the amounts of the current to be supplied to the solenoid coils 38a and 38b are increased by 10 A, respectively so as to increase the intensity of the magnetic field, then the point where the intensity of the magnetic field is 875 G moves downward (to the side of the substrate 14) by 30 mm. The present inventors have confirmed based on the experimental results that the plasma flame 15 has also moved downward by the same distance in this case. That is to say, by controlling the intensity of the gradient magnetic field, it is possible to arbitrarily control the position where the plasma is generated.

In this example, the gradient magnetic field is generated by using the solenoid coils. Alternatively, any other coils can also be used so long as a similar magnetic field to that shown in FIG. 5B can be generated. Therefore, the shape, the kind and the like of the coils are not limited to those of the solenoid coils mentioned above.

In order to avoid mixture of an impurity into the plasma, the point where the ECR state is provided is preferably located away from the heat-resistant dielectric plate 11 by at least 2 mm. To provide this state, it is necessary to locate the point where the intensity of the magnetic field is 875 G away from the heat-resistant dielectric plate 11 by at least 2 mm when the frequency of the microwave is 2.45 GHz.

EXAMPLE 5

Figure 12:
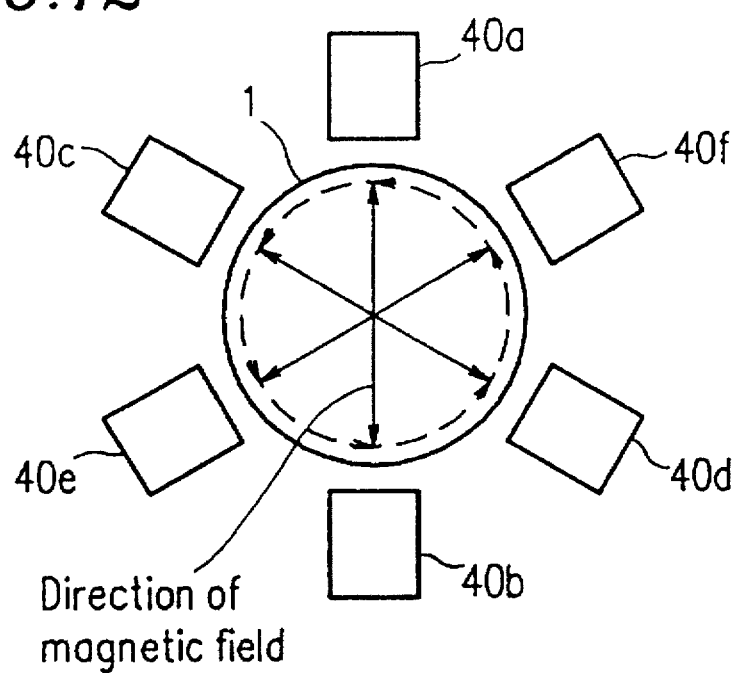
FIG. 12 is a top plan view showing a group of solenoid coils disposed around a waveguide axis in FIG. 11.

FIG. 11 is a cross-sectional view showing a configuration for a microwave plasma torch according to a fifth example of the present invention. A group of solenoid coils 40 are provided below the solenoid coils 38a and 38b. FIG. 12 is a top plan view showing the group of solenoid coils 40 disposed around the waveguide axis in FIG. 11. The group of solenoid coils 40 includes three pairs of solenoid coils 40a & 40b, 40c & 40d, and 40e & 40f. The three pairs of solenoid coils are disposed so that an angle of 60 degrees is formed between two lines of magnetic force to be generated.

First, a DC current is supplied to the solenoid coils 40a and 40b so that the direction of the magnetic field turns from the solenoid coil 40a to the solenoid coil 40b. Next, a DC current is supplied to the solenoid coils 40c and 40d so that the direction of the magnetic field turns from the solenoid coil 40c to the solenoid coil 40d and the current supplied to the solenoid coils 40a and 40b is turned off. Thereafter, by sequentially supplying and turning off the DC current to the respective solenoid coils so that the direction of the magnetic field is switched from the solenoid coil 40e to the solenoid coil 40f, from the solenoid coil 40b to the solenoid coil 40a, from the solenoid coil 40d to the solenoid coil 40c and from the solenoid coil 40f to the solenoid coil 40e, a rotational magnetic field is generated in the space inside the vacuum container 1.

Under the state where this rotational magnetic field is generated, the plasma flame 15 is generated. By supplying a DC current of 50 A to the solenoid coil 38a and a DC current of 20 A to the solenoid coil 38b, the gradient magnetic field shown in FIG. 10B is generated. Then, by sequentially supplying a DC current of 30 A to the respective solenoid coils 40a to 40f, a rotational magnetic field is generated.

Figure 13:
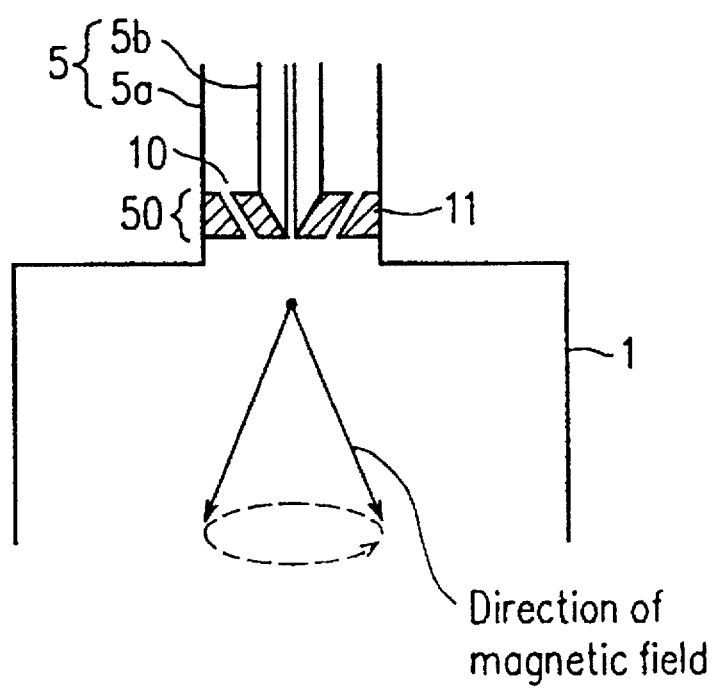
FIG. 13 shows a magnetic field generated inside the vacuum container 1.

FIG. 13 shows a magnetic field generated inside the vacuum container 1. The direction of the magnetic field at the points near the opening of the coaxial waveguide 5 changes as shown in FIG. 13. In FIG. 13, the arrows show the direction of the magnetic field synthesized by a static magnetic field generated by the solenoid coils 38a and 38b and the rotational magnetic field generated by the group of solenoid coils 40.

In this case, argon gas is supplied through the central gas inlet port 13 at a flow rate of 1000 cm$^3$/minute, for example. In addition, argon gas is also supplied through the gas inlet ports 36 at a flow rate of 2500 cm$^3$/minute, so as to inject the gas in a spiral shape through the gas injection holes 10. The pressure inside the vacuum container 1 is kept at 100 Torr, for example. A microwave having a frequency of 2.45 GHz and a power of 2 Kw is supplied to the rectangular waveguide 2. The microwave radiated through the heat-resistant dielectric plate 11 ionizes the gas injected through the gas injection holes 10. The present inventors have confirmed based on the experimental results that the plasma flame 15 is generated at a point about 5 mm away from the heat-resistant dielectric plate 11 and flows from the point toward the side of the substrate 14 in the same way as in the fourth example. The magnetic field exerting a magnetic force on the plasma flame 15 has a vector rotating with respect to the waveguide axis of the microwave. The electrons in the plasma are bound by this magnetic field, and it is possible to prevent the electrons from crashing onto the walls of the vacuum container 1 and disappearing. As a result, it is possible to generate and maintain a high density plasma over a wide range. The present inventors have confirmed based on the experimental results that a plasma flame with a length extended along the waveguide axis direction of the microwave has been generated. The rotation number per second of the rotational magnetic field is preferably in the range of 50 to 60, for example.

EXAMPLE 6

Figure 14:
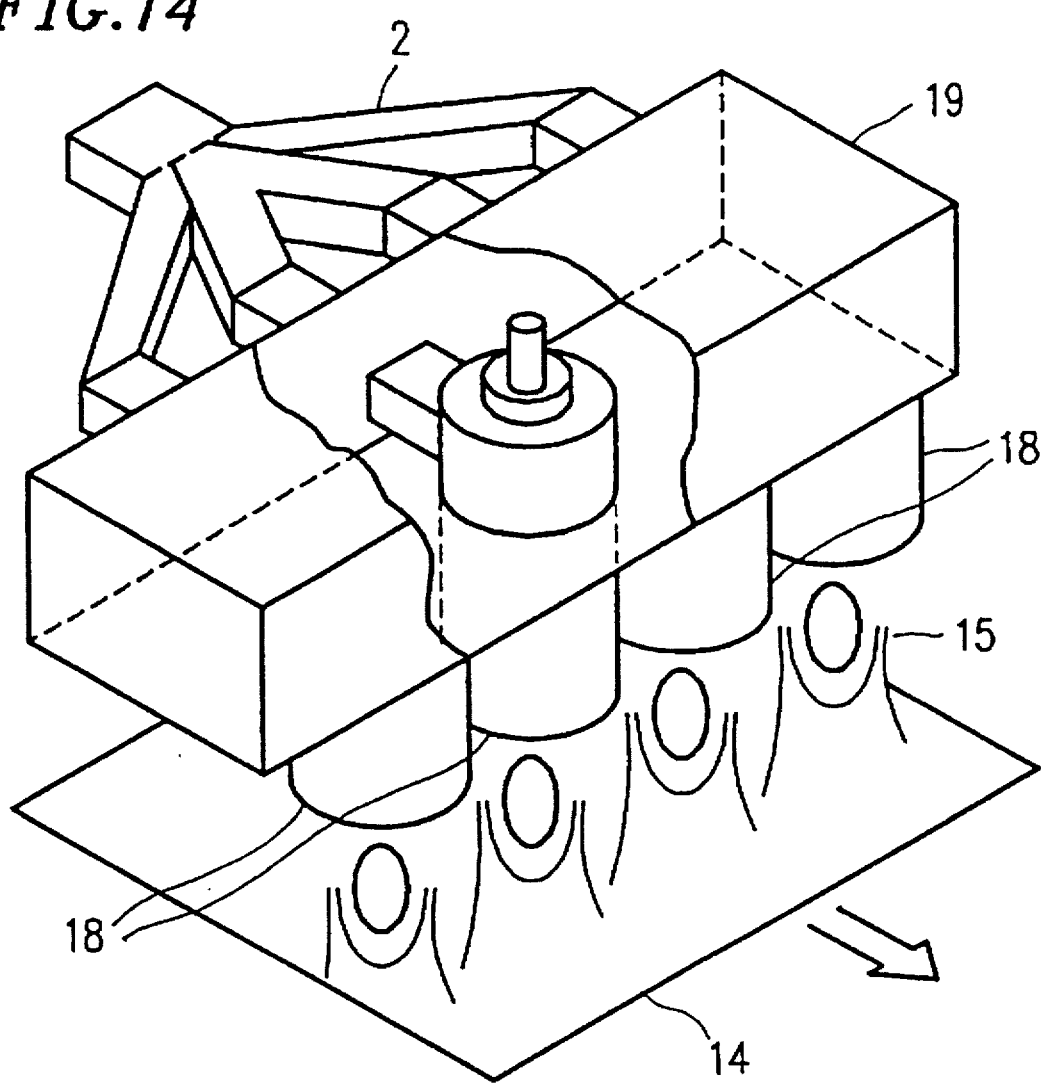
FIG. 14 is a perspective view showing a configuration for a microwave plasma torch according to a sixth example of the present invention.

FIG. 14 is a perspective view showing a configuration for a microwave plasma torch according to a sixth example of the present invention. The plasma torch of this example includes a plurality of units of plasma torches according to one of the foregoing Examples 1 to 5. For example, a group of plasma torches 19 is formed by arranging four units of plasma torches 18 of the first example. In this example, the rectangular waveguide 2 is divided into four branches, thereby supplying a microwave to the respective plasma torches 18. If plasma is generated by the respective plasma torches 18 in the same way as in the first example, then plasma flames 15 are formed in elongate regions, respectively. By disposing the substrate 14 below the plasma flames 15 and moving the substrate 14 to the direction indicated by the arrow shown in FIG. 14, a large-area portion of the substrate can be processed.

In this example, the rectangular waveguide is divided into a plurality of branches. However, a rectangular waveguide is not limited to such a branched waveguide but can be formed in any shape, so long as electric power can be supplied to respective plasma torches. In addition, the arrangement of the plasma torches is not limited to a longitudinal row. For example, the plasma torches can be arranged in a circle.

EXAMPLE 7

Figure 15:
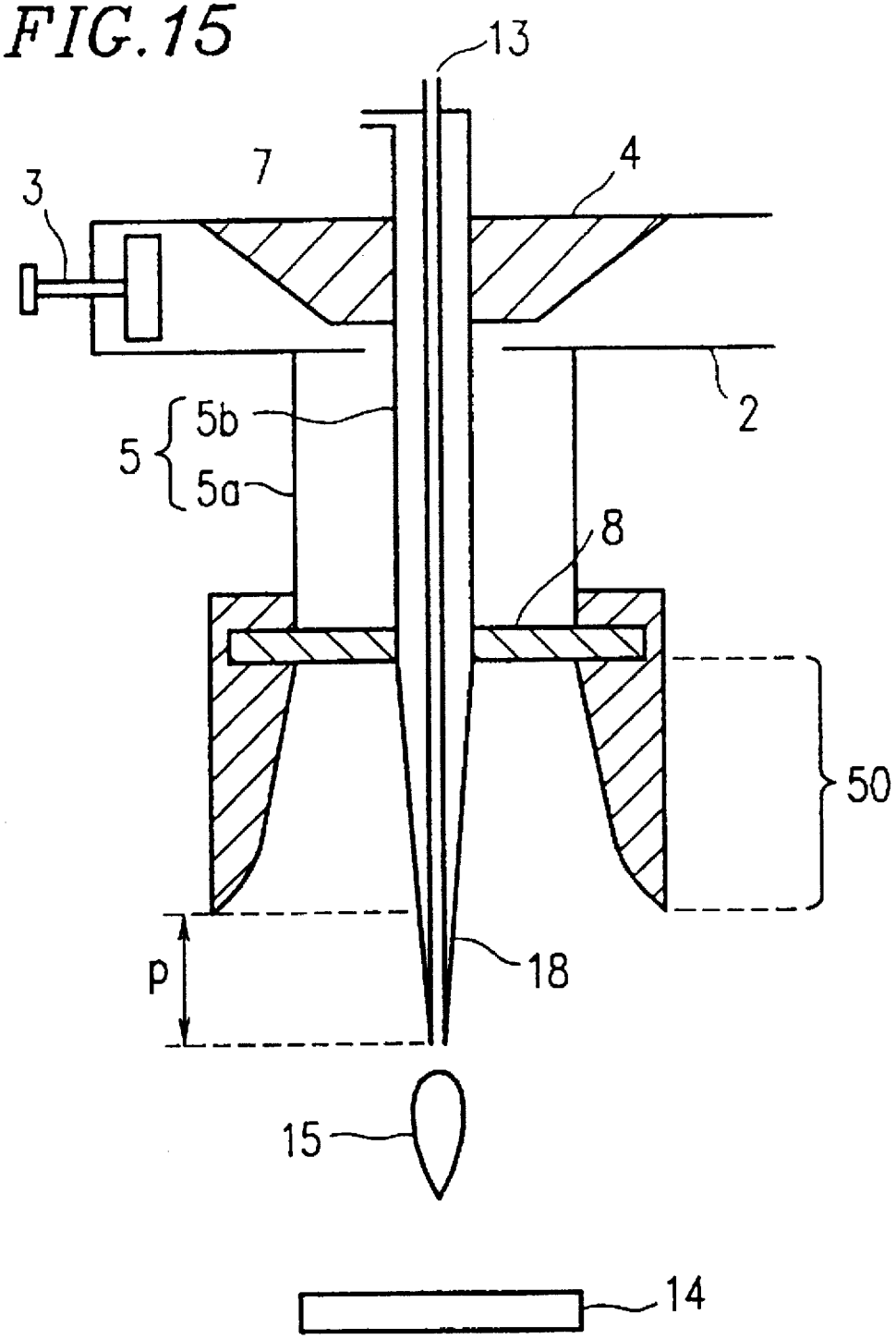
FIG. 15 is a cross-sectional view showing a configuration for a microwave plasma torch according to a seventh example of the present invention.

FIG. 15 is a cross-sectional view showing a configuration for a microwave plasma torch according to a seventh example of the present invention. The plasma torch of the seventh example is the same as the plasma torch of the first example except that the top end portion 18 of the inner conductor 5b is more protrudent than the outer conductor 5a along the waveguide axis and that the heat-resistant dielectric plate 11 is not provided. In the taper portion 50, the ratio of the diameter of the inner conductor 5b of the coaxial waveguide 5 to that of the outer conductor 5a thereof monotonically decreases. A reactant gas is introduced into the core of the plasma flame 15 at a high temperature through a central gas inlet port 13. As a result, the reactant gas is efficiently decomposed and a substrate can be processed at a high rate in the same way as in the first example.

Since the top end portion 18 of the inner conductor 5b is more protrudent than the outer conductor 5a, a plasma flame 15 having a diameter of 5 mm or less can be generated in the top end portion 18. As a result, a small area portion of a substrate can be processed by using the plasma torch of this example. Specifically, when the outer conductor 5a is 39 D (φ39 mm), the length p of the protrudent top end portion 18 of the inner conductor 5b shown in FIG. 15 is preferably about 10 mm in order to generate a stable small plasma flame. If the length p is longer than this length, the plasma flame 15 becomes unstable. On the contrary, if the length p is shorter than this length, plasma flame is generated between the inner and outer conductors, so that the plasma flame 15 also becomes unstable.

In the description of the first to the seventh example, the terms of the "dielectric plate", the "heat-resistant dielectric plate" and the like do not limit the shape of the dielectric material to a "plate-shaped" material. In other words, a block-shaped dielectric material may be used instead of the plate-shaped material.

The unit for generating the gradient magnetic field described in Example 4 may be combined with the microwave plasma torch and the method for generating plasma described in Examples 1–3 and 6–7. Further, the unit for generating the rotational magnetic field described in Example 5 may be combined with the microwave plasma torch and the method for generating plasma described in Examples 1–3 and 6–7.

In a plasma torch according to the present invention, at least two of a plurality of injection axes are located at torsional positions with respect to the waveguide axis, and do not exist in the plane vertical to the waveguide axis. As a result, the gas injected through the gas supplying portion flows through the vacuum container while forming spiral fluxes and without generating a turbulent flow, so that a discharge can be maintained stably and uniformly over a wide space. In the case where all of the plurality of injection axes are located at torsional positions with respect to the waveguide axis and do not exist in the plane vertical to the waveguide axis, it is possible to further reduce the amount of the turbulent flow generated by the gas.

If the ratio of the diameter of the inner conductor of the coaxial waveguide to the diameter of the outer conductor thereof decreases toward the vacuum container along the waveguide axis in the taper portion of the coaxial waveguide, then it is possible to efficiently propagate the microwave to the opening of the coaxial waveguide in a satisfactorily matched state. As a result, the arc discharge caused by the concentration of the electric field is not generated, and the elements composing a member of the plasma torch are not mixed into the plasma as an impurity. Since the microwave is radiated into the vacuum container, the plasma can be generated at a point away from the coaxial waveguide. Therefore, the elements composing a member of the coaxial waveguide are not mixed into the plasma as an impurity. Since it is possible to prevent an impurity from being mixed into the plasma, a high purity processing (for a thin film deposition, for example) can be performed.

If the top end portion of the inner conductor of the coaxial waveguide on the vacuum container side includes at least one gas injection hole, the reactant gas can be led into the core of the plasma at a high temperature. As a result, the reactant gas can be efficiently decomposed, and a substrate can be processed at a high rate.

If a heat-resistant dielectric plate is provided between the inner conductor and the outer conductor in the vicinity of the opening of the coaxial waveguide, then the gas injection holes can be provided for the heat-resistant dielectric plate, thereby stably generating plasma. In this case, the gas injection holes are not damaged even when the holes are exposed to high-temperature plasma.

If the top end portion of the inner conductor of the coaxial waveguide is covered with a heat-resistant dielectric plate, then the contact between the plasma and the top end portion of the inner conductor can be prevented, so that the elements composing the coaxial waveguide are not mixed into the plasma as an impurity.

If a heat-resistant dielectric plate contains the same components as those of a reactant material contained in the supplied gas, then an impurity is not mixed into the plasma. This is because, even when the heat-resistant dielectric plate is etched by the contact between a plasma flame and the heat-resistant dielectric plate, the same components as those of the reactant material contained in the supplied gas are introduced into the plasma.

If the top end portion of the inner conductor of the coaxial waveguide is divided into a plurality of branches, then the microwave is radiated at a wide solid angle over a broad range inside the vacuum container. As a result, a larger plasma flame can be uniformly formed and a large area of a substrate can be processed.

If the intensity of the magnetic field along the axial direction on the axis of the coaxial waveguide gradually decreases toward the opening of the waveguide along the axis of the coaxial waveguide, then it is possible to control the region where plasma is generated by controlling the intensity of the magnetic field. As a result, the plasma can be generated at a point away from the opening of the coaxial waveguide and the elements composing a member of the waveguide are not mixed into the plasma. Consequently, a high-purity processing can be performed.

If a gradient magnetic field generator for forming a magnetic field distribution, where the intensity of the magnetic field along the axial direction on the axis of the coaxial waveguide becomes 875 G at a point away from the opening of the coaxial waveguide and gradually decreases toward the center portion of the vacuum container along the axis of the waveguide, is provided, then the point where the magnetic field is intense enough to cause an ECR state is away from the opening of the waveguide. As a result, at this point, the electrons are likely to fall into the ECR state even in a low vacuum region, and the density of the electrons becomes higher than the other points. Plasma is generated at this point and the plasma flame extends to the direction where the intensity of the magnetic field weakens. Therefore, since the plasma flame is generated at such a point away from the opening of the waveguide, it is possible to prevent the elements composing the waveguide from being mixed into the plasma flame as an impurity.

By generating a rotational magnetic field in addition to the gradient magnetic field, the electrons in the plasma are bound by the rotational magnetic field, so that it is possible to prevent the electrons from crashing onto the walls or the like of the vacuum container and disappearing. As a result, a high-density plasma can be generated and a processing area can be enlarged.

If a plurality of plasma torch units are used, then a plasma flame is generated over a wide range. Consequently, a large-area processing can be performed.

If the inner conductor of the coaxial waveguide is more protrudent than the outer conductor, then a plasma flame with a minimal size is generated in the top end portion of the inner conductor. As a result, only a minimal area of a substrate can be selectively processed with plasma.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A microwave plasma torch comprising:

a vacuum container having an evacuation means;

a coaxial waveguide including an inner conductor and an outer conductor, a first end portion of the coaxial waveguide being connected with a microwave supplying means for supplying a microwave and a second end portion of the coaxial waveguide being connected with the vacuum container, thereby introducing the microwave supplied from the microwave supplying means into the vacuum container along a waveguide axis of the coaxial waveguide; and a gas supplying means for injecting a gas into the vacuum container along a plurality of injection axes, wherein at least two of the plurality of injection axes are located at torsional positions with the waveguide axis in the second end portion, and do not exist in a plane perpendicular to the waveguide axis, and wherein a ratio of a diameter of the inner conductor to a diameter of the outer conductor in a vicinity of the second end portion decreases from the first to the second end portion along the waveguide axis.

2. A microwave plasma torch according to claim 1, wherein the gas supplying means comprises a dielectric plate which is disposed between the first end portion and the second end portion and includes a plurality of gas injection holes for injecting the gas into the vacuum container along the plurality of injection axes.

3. A microwave plasma torch according to claim 2, wherein the dielectric plate has heat-resistance.

4. A microwave plasma torch according to claim 3, wherein all of the plurality of injection axes are located at torsional positions with the waveguide axis and do not exist in the plane perpendicular to the waveguide axis.

5. A microwave plasma torch according to claim 4, wherein a top end portion of the inner conductor in a vicinity of the second end portion is covered with a heat-resistant dielectric plate.

6. A microwave plasma torch according to claim 5, wherein the dielectric plate contains the same components as those of a reactant material contained in the gas.

7. A microwave plasma torch according to claim 1, wherein the inner conductor includes at least one gas injection hole for injecting a gas in the second end portion.

8. A microwave plasma torch according to claim 7, wherein the inner conductor is more protrudent than the outer conductor into the vacuum container in the second end portion.

9. A microwave plasma torch according to claim 1, wherein the second end portion of the inner conductor is divided into a plurality of branches.

10. A microwave plasma torch according to claim 1, further comprising a gradient magnetic field generation means for generating a magnetic field having an intensity gradually decreasing from the first end portion to the second end portion along the waveguide axis.

11. A microwave plasma torch according to claim 10, wherein the gradient magnetic field generation means generates a magnetic field intense enough to cause an electron cyclotron resonance (ECR) state at a point away from the second end portion of the coaxial waveguide in the vacuum container.

12. A microwave plasma torch according to claim 10, further comprising a rotational magnetic field generation means for generating a rotational magnetic field in the vacuum container.

13. A microwave plasma torch according to claim 1, comprising a plurality of the coaxial waveguides and a plurality of the gas supplying means.

14. A microwave plasma torch comprising a vacuum container having an evacuation means, and a coaxial waveguide including an inner conductor and an outer conductor, a first end portion of the coaxial waveguide being connected with a microwave supplying means for supplying a microwave and a second end portion of the coaxial waveguide being connected with the vacuum container, thereby introducing the microwave supplied from the microwave supplying means into the vacuum container along a waveguide axis of the coaxial waveguide, wherein the inner conductor includes at least one gas injection hole for injecting a gas and is more protrudent than the outer conductor into the vacuum container in the second end portion, and wherein a ratio of a diameter of the inner conductor to a diameter of the outer conductor in a vicinity of the second end portion decreases from the first to the second end portion along the waveguide axis.

15. A method for generating plasma in a vacuum container of a microwave plasma torch comprising the vacuum container and a coaxial waveguide, comprising the steps of:

introducing a microwave into the vacuum container along a first axis, and injecting a gas into the vacuum container along a plurality of injection axes, wherein at least two of the plurality of injection axes are located at torsional positions with a waveguide axis of the coaxial waveguide, and do not exist in a plane perpendicular to the waveguide axis.

16. A method for generating plasma according to claim 15, further comprising a step of generating a magnetic field having an intensity decreasing in a direction along the waveguide axis toward the vacuum container.

17. A method for generating plasma according to claim 16, further comprising a step of generating a rotational magnetic field in the vacuum container.

18. A method for generating plasma according to claim 15, further comprising a step of generating a rotational magnetic field in the vacuum container.

* * * * *